United States Patent
Kirkpatrick

(10) Patent No.: US 10,451,688 B2
(45) Date of Patent: Oct. 22, 2019

(54) IN-PACKAGE SENSOR MEMORY READOUT

(71) Applicant: Honeywell International Inc., Morris Plains, NJ (US)

(72) Inventor: Richard Kirkpatrick, Richardson, TX (US)

(73) Assignee: Honeywell International Inc., Morris Plains, NJ (US)

( * ) Notice: Subject to any disclaimer, the term of this patent is extended or adjusted under 35 U.S.C. 154(b) by 276 days.

(21) Appl. No.: 15/465,291

(22) Filed: Mar. 21, 2017

(65) Prior Publication Data

US 2018/0275203 A1 Sep. 27, 2018

(51) Int. Cl.
    *G01R 31/26* (2014.01)
    *G01R 33/00* (2006.01)

(52) U.S. Cl.
    CPC ..... *G01R 33/0023* (2013.01); *G01R 33/0047* (2013.01)

(58) Field of Classification Search
    CPC ........ G01R 33/02; G01R 33/07; G01R 33/09; G01R 33/0035; G01R 33/0023; G01R 33/0047
See application file for complete search history.

(56) References Cited

U.S. PATENT DOCUMENTS

| | | | |
|---|---|---|---|
| 7,477,545 B2 | 1/2009 | Tu et al. | |
| 8,723,507 B2 | 5/2014 | Kirkpatrick et al. | |
| 8,869,613 B2 | 10/2014 | Buschnakowski et al. | |
| 9,970,996 B2 * | 5/2018 | Fernandez | G01P 13/00 |
| 10,109,178 B2 * | 10/2018 | Keene | G01V 11/00 |
| 2004/0085845 A1 * | 5/2004 | Ooishi | G11C 5/14 365/226 |
| 2013/0271124 A1 * | 10/2013 | Kirkpatrick | G01R 33/07 324/251 |
| 2016/0064058 A1 * | 3/2016 | Janesky | G11C 29/12 365/96 |
| 2016/0252589 A1 | 9/2016 | Raman et al. | |
| 2018/0315461 A1 * | 11/2018 | Lee | G11C 29/028 |

* cited by examiner

*Primary Examiner* — Thang X Le
(74) *Attorney, Agent, or Firm* — Seager, Tufte & Wickhem LLP

(57) ABSTRACT

A packaged sensor having three external electrical terminals. The packaged sensor comprises a package housing, a power input terminal, a ground terminal, a sensing device, a sensor output terminal for providing an output signal that is related to a physical quantity sensed by the sensing device when the packaged sensor is operated in a sensing mode of operation and for providing a data readout signal related to stored data when the packaged sensor is operated in a data readout mode of operation, a sensing block coupled to the sensing device and to the sensor output terminal, and an adjustment block coupled to the power input terminal, coupled to the sensing block, coupled to the sensor output terminal, comprising a memory storing the stored data, and operable to modulate the data readout signal onto the sensor output terminal in response to a data readout command modulated onto the power input terminal.

17 Claims, 8 Drawing Sheets

IN-PACKAGE SENSOR MEMORY READOUT

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Sensors may be electronic devices that transduce a physical property to an electrical signal that in some way represents a physical quantity. For example, sensors may output an electrical signal that represents a flow rate, a temperature, a magnetic field intensity, a pressure, or other physical quantity. External equipment may condition the signal to turn it into a more useful measure, for example converting the electrical signal into a digital value or converting the electrical signal to conventional units. Sensors may be applied in a wide variety of physical systems such as inlet flues of industrial boilers, bleed air systems in aircraft, and others. Sensors may be manufactured to be inexpensive and/or of small size. As part of the process of designing for manufacturing, external electrical terminals of sensors may be reduced to a small number, whereby to reduce a size of the sensor, to reduce a manufacturing cost of the sensor, and possibly to make assembly of the sensor into a physical system easier and more convenient.

SUMMARY

In an embodiment, a packaged magnetic field sensor is disclosed. The packaged magnetic field sensor comprises a package housing, a power input terminal accessible from outside of the package housing, a magnetic field sensing device situated in the package housing, a sensor output terminal, a sensing block, and an adjustment block. The sensor output terminal is accessible from outside of the package housing for providing an output signal that is related to a magnetic field sensed by the magnetic field sensing device when the packaged magnetic field sensor is operated in a magnetic field sensing mode of operation and for providing a data readout signal related to stored data when the packaged magnetic field sensor is operated in a data readout mode of operation. The sensing block is situated in the package housing and is electrically coupled to the magnetic field sensing device and to the sensor output terminal. The adjustment block is situated in the package housing and is coupled to the power input terminal, coupled to the sensing block, coupled to the sensor output terminal, comprising a memory storing the stored data, operable to adjust at least one parameter of the output signal based on at least part of the stored data when the packaged magnetic field sensor is operated in the magnetic field sensing mode of operation, and operable to modulate the data readout signal onto the sensor output terminal in response to a data readout command modulated onto the power input terminal when the packaged magnetic field sensor is operated in the data readout mode of operation.

In another embodiment, a packaged sensor having three external electrical terminals is disclosed. The packaged sensor comprises a package housing, a power input terminal accessible from outside of the package housing, a ground terminal accessible from outside the package housing, a sensing device situated in the package housing, a sensor output terminal, a sensing block situated in the package housing, and an adjustment block. The sensor output terminal is accessible from outside of the package housing for providing an output signal that is related to a physical quantity sensed by the sensing device when the packaged sensor is operated in a sensing mode of operation and for providing a data readout signal related to stored data when the packaged sensor is operated in a data readout mode of operation. The sensing block is electrically coupled to the sensing device and to the sensor output terminal. The adjustment block is situated in the package housing and is coupled to the power input terminal, coupled to the sensing block, coupled to the sensor output terminal, comprises a memory storing the stored data, and is operable to modulate the data readout signal onto the sensor output terminal in response to a data readout command modulated onto the power input terminal when the packaged sensor is operated in the data readout mode of operation.

In yet another embodiment, a method of reading out data stored in a packaged sensor having three external electrical terminals is disclosed. The method comprises stimulating a power input terminal of the packaged sensor with a serial polar return-to-zero read message, where the read message identifies a readout command and identifies a memory bank of the packaged sensor, stimulating the power input terminal of the packaged sensor with a polar return-to-zero clock signal, reading a serial polar return-to-zero data word from a sensor output terminal of the packaged sensor, and decoding the serial polar return-to-zero data word to determine the data stored in the memory bank of the packaged sensor identified in the read message.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The present disclosure teaches a packaged sensor having three electrical terminals that may be programmed through a power terminal to store data in an internal memory and may be programmed to output a selected portion of stored data from the internal memory on an output terminal of the packaged sensor. The power terminal may be stimulated with a serial polar return-to-zero (RTZ) format signal. For example, the packaged sensor may be stimulated by a power-on ramp raising the voltage on the power terminal to about 8 volts. This power may be used by an internal voltage regulator to power internal electronic components of the packaged sensor. The power level may be modulated from the about 8 volts to an about 11 volts back to the about 8 volts to convey a "1" binary value in RTZ format. The power level may be modulated from the about 8 volts to an about 4.1 volts back to the about 8 volts to convey a "0" binary value in RTZ format.

A series of RTZ formatted bits may be input on the power terminal to signal a write command message, to identify a location in the internal memory, and to signal write data. The write data may be stored in the internal memory, for example by raising the voltage on the power terminal to about 19.5 volts for a duration of about 12 ms or for example by triggering an internal charge pump electrical component within the packaged sensor to self-generate the about 19.5 volts and apply it for a duration of about 12 ms to the internal memory to store the data non-volatilely. The data stored in the internal memory may be used by an adjustment block to modify an output of the sensing device. Alternatively, the data may store information about the packaged sensor, such as a manufacturing code, a manufacturing date, or other information. A series of RTZ formatted bits may be input on the power terminal to signal a readout command message and to signal which of a plurality of locations in the internal memory is to be read out on the output terminal of the packaged sensor.

Figure 1:
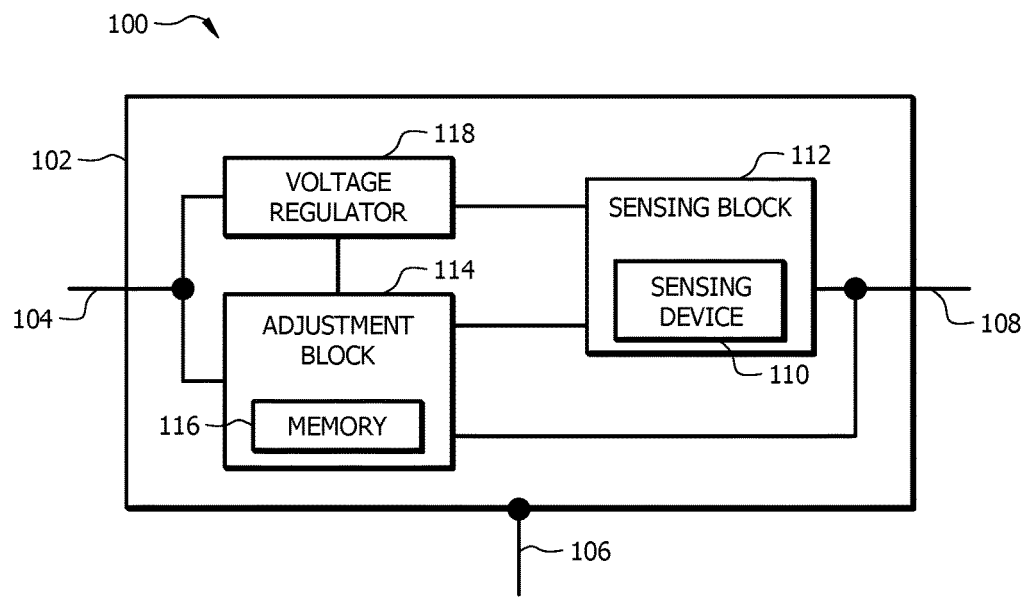
FIG. 1 is a block diagram of a packaged sensor according to an embodiment of the disclosure.
Figure 2:
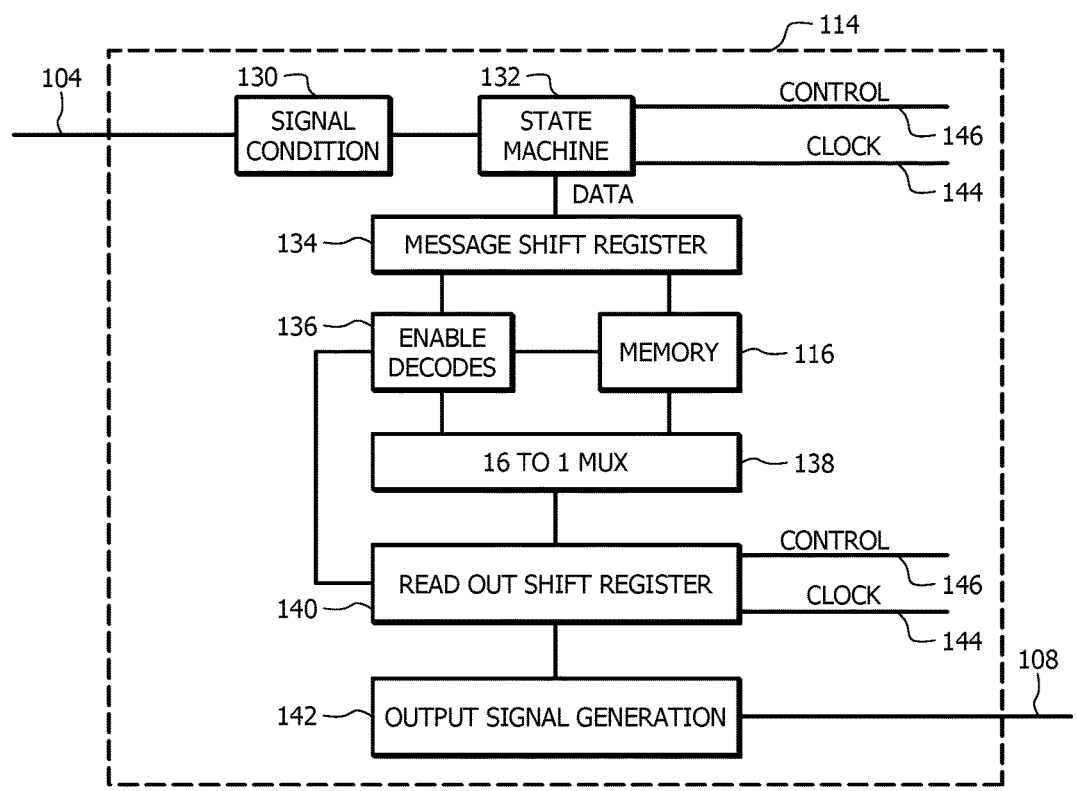
FIG. 2 is a block diagram of an adjustment block according to an embodiment of the disclosure.

Turning now to FIG. 1, a packaged sensor 100 is described. In an embodiment, the packaged sensor 100 comprises a package 102, a power electrical terminal 104, a ground electrical terminal 106, an output electrical terminal 108, a sensing device 110, a sensing block 112 containing the sensing device 110, an adjustment block 114 containing a memory 116, and a voltage regulator 118. The package 102 may be a plastic housing, a ceramic housing, or another material housing. The voltage regulator 118 may be electrically coupled to the adjustment block 114 and to the sensing block 112 and provide a regulated voltage when a sufficient voltage is applied to the power electrical terminal 104 and a ground is provided to the ground electrical terminal 106. The ground electrical terminal 106 may be electrically connected to various components within the packaged sensor 100. The voltage regulator 118 may provide a relatively constant supply voltage to the sensing block 112 and to the adjustment block 114 so long as it receives a sufficient voltage and may block passage of higher voltage levels to the power supply of these devices. The sensing device 110 may be a magnetic field intensity sensor, a flow rate sensor (e.g., sensing a fluid flow rate, a liquid flow rate, a gas flow rate), a temperature sensor, a pressure sensor, a displacement sensor, a relative humidity sensor, a force sensor, a presence of gas (a presence of carbon monoxide (CO) gas, a presence of hydrogen sulfide ($H_2S$) gas, or presence of another gas), or other sensor. The memory 116 may be an electrically erasable programmable read only memory (EEPROM) or other non-volatile memory Turning now to FIG. 2, further details of the adjustment block 114 are described. In an embodiment, the adjustment block 114 comprises a signal conditioning block 130, a state machine 132, a message shift register 134, an enable decodes block 136, the memory 116, a multiplexor 138, a readout shift register 140, and an output signal generation block 142. In a data programming mode of operation and in a data readout mode of operation, the signal conditioning block 130 may condition serial polar RTZ signals to a form useable by the state machine 132. The state machine 132 may generate a variety of signals from the serial polar RTZ signals such as a clock 144 and one or more control signals 146. The state machine 132 may further parse serial polar RTZ signals into a write message or a readout message. The state machine 132 may output a memory block identity to the enable decodes block 136, for example an address of a location in the memory 116. The state machine 132 may output data from a write message to the memory 116 for non-volatile storage in the memory 116.

The enable decodes block 136 may output a read enable to promote selecting one of a plurality of blocks of data in the memory 116 to be output by the multiplexor 138. The selected data output by the multiplexor 138 may be stored in the readout shift register 140 in response to the clock 144. After the selected data is stored in the readout shift register 140, further clock 144 signals may shift the selected data serially from the readout shift register 140 to the output signal generation block 142 which conditions the serial readout data on the output pin 108 to a serial RTZ format suitable for reading by an external device such as an external programmer-readout fixture.

Figure 3:
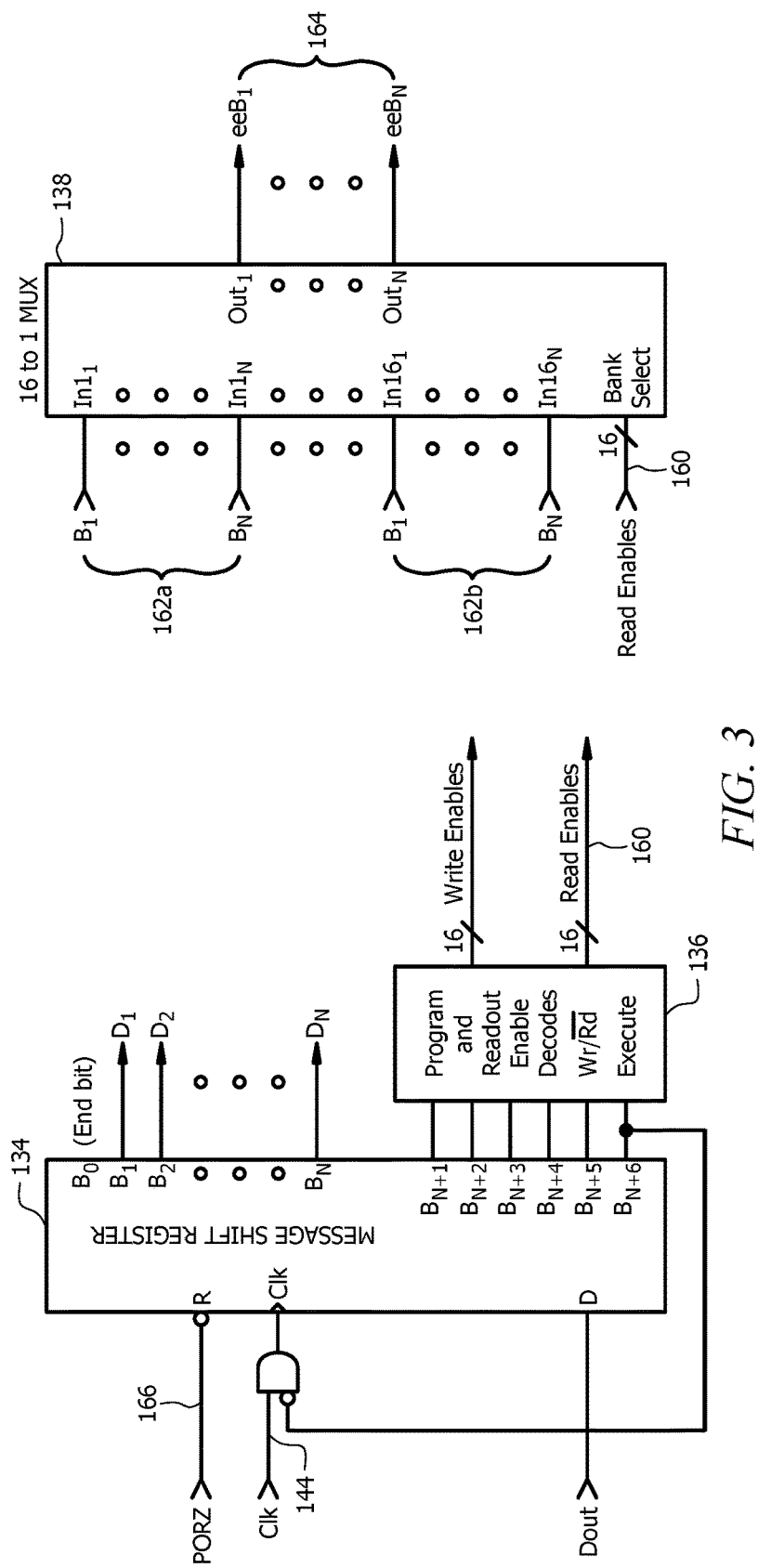
FIG. 3 is a block diagram of a message shift register and a multiplexor according to an embodiment of the disclosure.

Turning now to FIG. 3, an embodiment of the message shift register 134, the enable decodes block 136, and the multiplexor 138 is described. It is understood that the teachings of the present disclosure contemplate other embodiments. In particular, while certain numbers of bits, decode lines, and memory blocks are implied in FIG. 3, in other embodiments other numbers of bits, decode lines, and memory blocks may be implemented in the adjustment block 114.

In an embodiment, the event of ramping electrical power on the power terminal 104 is used by the signal conditioning block 130 and/or the state machine 132 to generate a power on reset pulse 166 that is distributed to the message shift register 134 and possibly other internal circuitry. In response to the power on reset pulse 166, the message shift register 134 clears its stored data. As data is shifted into the message shift register 134 by the state machine 132 data may be stored for writing to the memory 116 (in the instance that a write command message is received by the adjustment block 114 on the power terminal 104). A write enable may select a specific address or location in the memory 116 and 1 through n-number of bits may be written in parallel into the addressed location in memory 116. Part of the data that is shifted into the message shift register 134 is provided to the enable decodes block 136 to select which location in the memory 116 to work on (e.g., to write data to or to readout data from), to select whether to write to or readout from memory 116, and to execute.

The multiplexor 138 may receive n-inputs from each of a plurality of memory locations or memory banks in the memory 116. As illustrated in FIG. 3, the multiplexor 138 receives n-bits from each of 16 memory banks in the memory 116, but in another embodiment a different number of memory banks may be implemented in the memory 116 and input to the multiplexor 138. A read enable 160 may select one of the memory banks to be output by the multiplexor 138 on n-lines of readout data 164.

Figure 4:
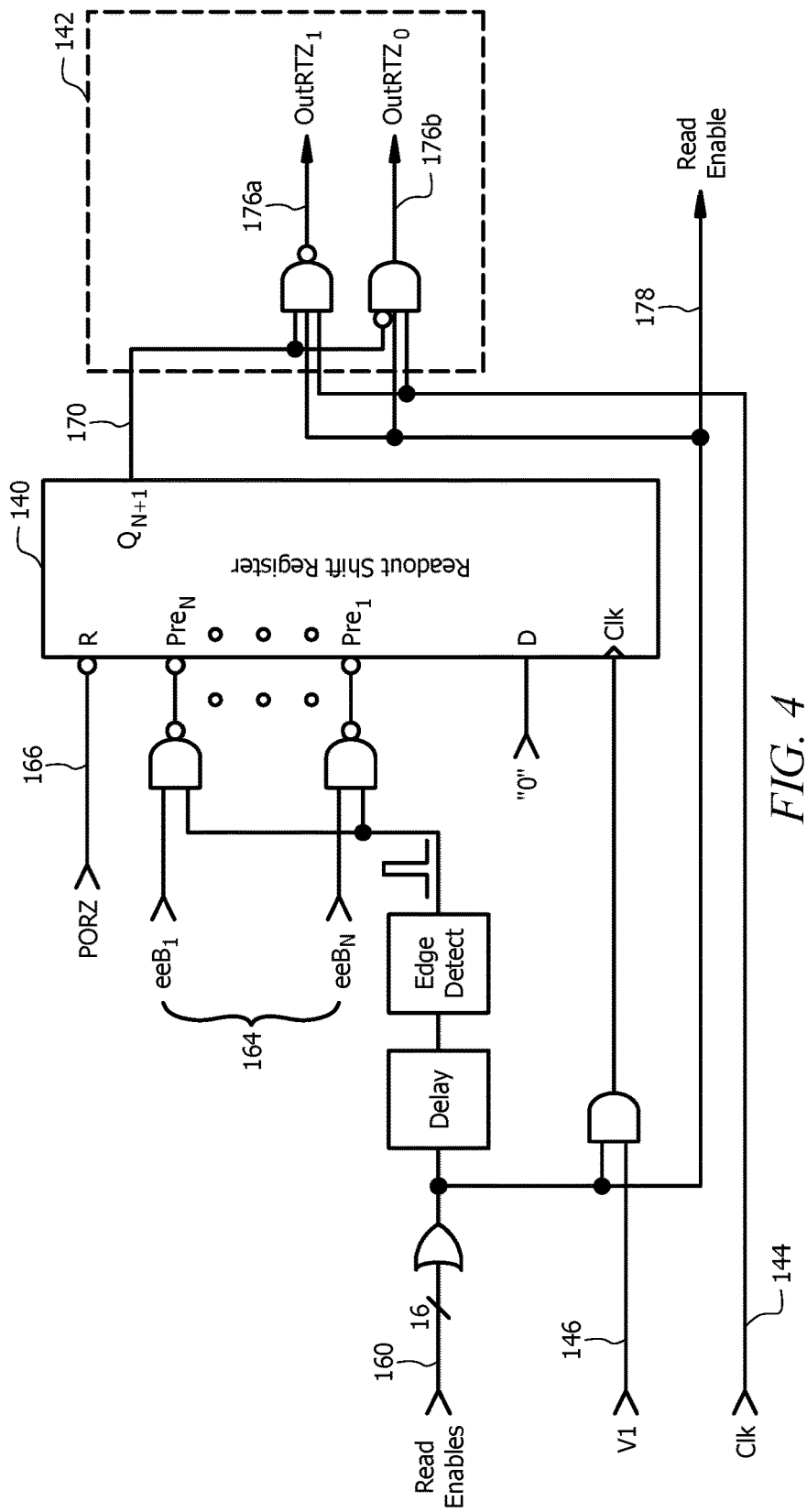
FIG. 4 is a block diagram of a readout shift register according to an embodiment of the disclosure.

Turning now to FIG. 4, a readout shift register 140 is described. The readout shift register 140 receives the n-lines of readout data 164 as well as the power on reset pulse 166. The power on reset pulse 166 can zero the contents of the shift register. Other control signals such as the read enable can cause the n-lines of readout data 164 to be stored in parallel in the readout shift register 140. The readout data stored in the readout shift register 140 may then be shifted out of an output 170 in response to a control 146 output by the state machine 132. The output 170 is processed by circuitry of the output signal generation block 142 including a binary "1" return-to-zero 176a line and a binary "0" return-to-zero 176b line.

Figure 5:
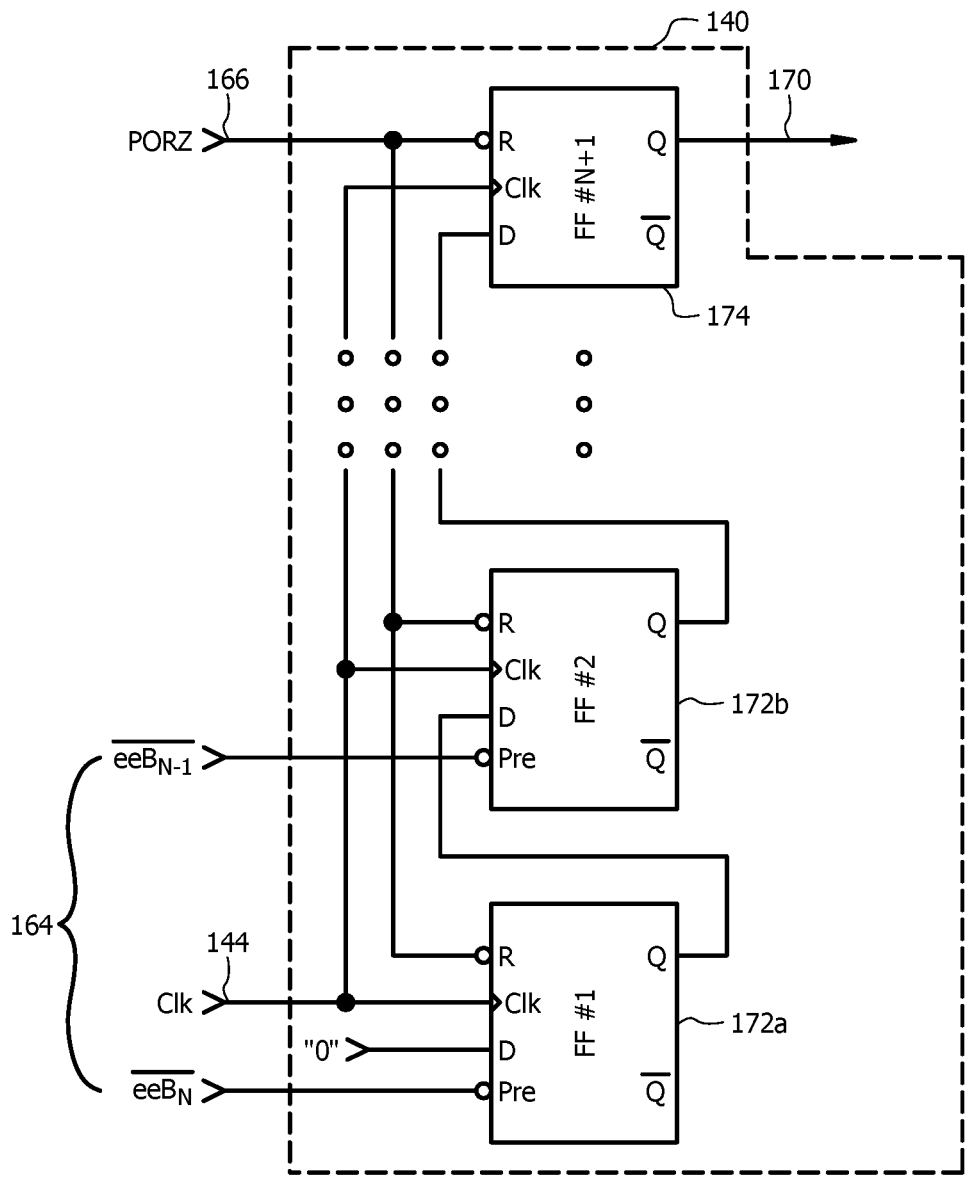
FIG. 5 is a block diagram of flip-flops implementing a portion of a readout shift register according to an embodiment of the disclosure.

Turning now to FIG. 5, an exemplary embodiment of a readout shift register 140 is described. The readout shift register 140 may be implemented as a plurality of n+1 flip-flops. The first 1 through n-number of flip-flops 172 may be initialized with n-data values from the multiplexor 138. Then the n-bits are shifted from one flip-flop to another flip-flop to serially shift out of the flip-flop 174 on the output line 170.

Figure 6:
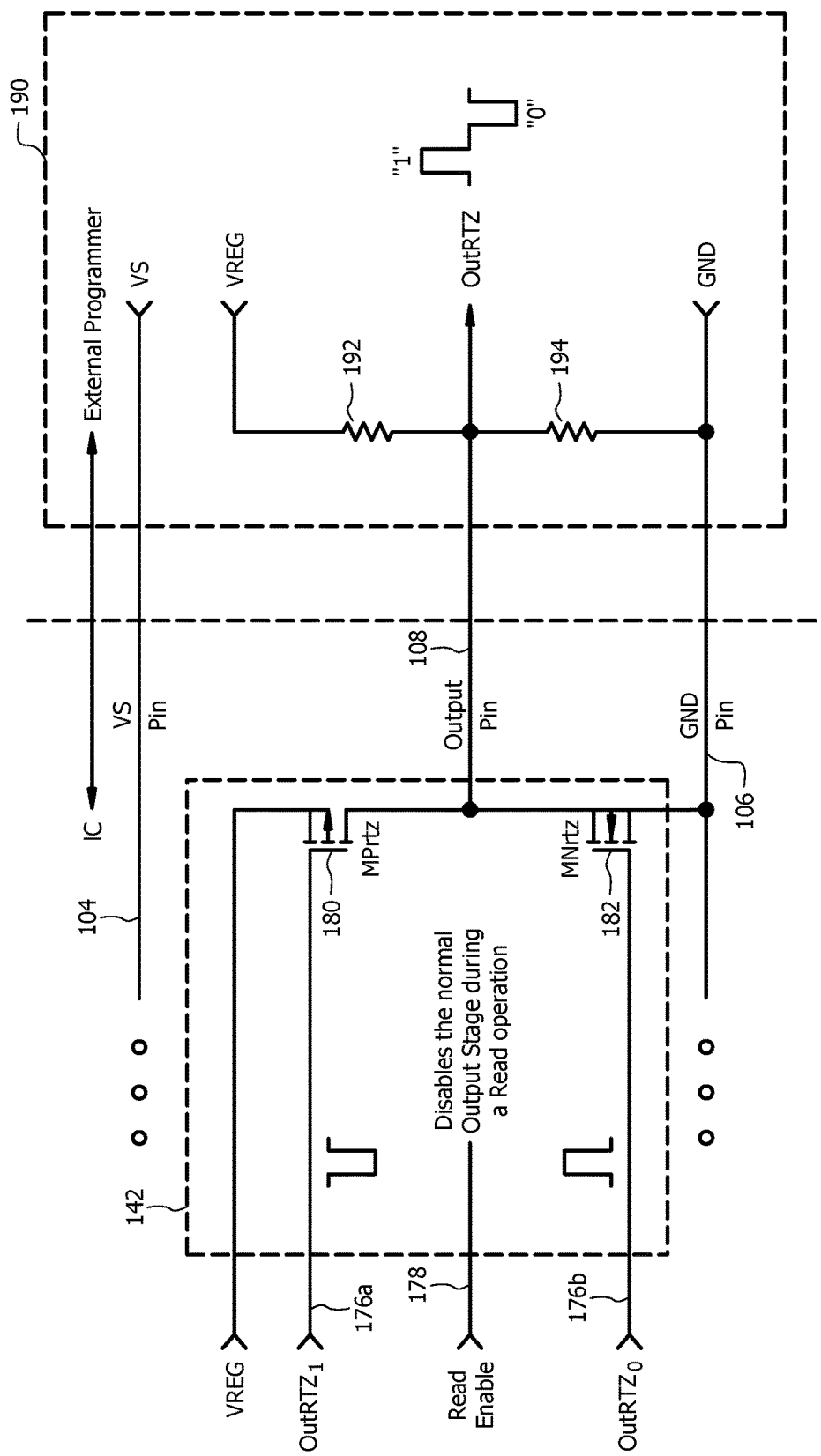
FIG. 6 is an illustration of an output signal generation block according to an embodiment of the disclosure.

Turning now to FIG. 6, further details of the output signal generation block 142 and an exemplary coupling to an external programmer data readout fixture 190 are described. An external programmer data readout fixture 190 (hereinafter referred to as the external fixture 190) may be connected to the packaged sensor 100 by the power terminal 104, the ground terminal 106, and the output terminal 108. Said in other words, the packaged sensor 100 may be plugged into a socket of the external fixture 190, and the external fixture 190 may provide electrical power and electrical ground to the packaged sensor 100 and may readout data from the packaged sensor 100 on the output terminal 108. It is understood that the electrical power that is provided by the external fixture 190 can include a sufficient voltage to enable the voltage regulator 118 to supply regulated electrical power to the adjustment block and to the sensing block 112. Further, the electrical power that is provided by the external fixture 190 may comprise serial polar return-to-zero format signals (e.g., return-to-zero serial binary signals modulated onto the power terminal 104). For example, the external fixture 190 may be used to program one or more banks of data into the memory 116 by transmitting one or more write messages in serial polar RTZ format to the power terminal 104. Likewise, the external fixture 190 may be used to readout one or more banks of data from the memory 116 by transmitting one or more readout messages in serial polar RTZ format to the power terminal 104 and by demodulating readout data on the output terminal 108.

The external fixture 190 may comprise a readout block that comprises a first resistor 192 connected to a voltage at a first terminal at a Vreg voltage level and a second resistor 194 connected at a first terminal to a second terminal of the first resistor 192 and connected at a second terminal to electrical ground. The node where the first resistor 192 and the second resistor 194 are connected to each other is electrically coupled to the output terminal 108 of the packaged sensor 100. The electrical ground of the external fixture 190 may be electrically coupled to the ground terminal 106 of the packaged sensor 100.

The output signal generation block 142 further comprises a p-channel field effect transistor (PFET) 180 and an n-channel field effect transistor (NFET) 182 that are configured as switches. In the biasing condition illustrated in FIG. 6, when binary "1" return-to-zero 176a is at a logic high value, the PFET 180 is biased off and presents a high impedance, and when binary "0" return-to-zero 176b is at a logic low value, the NFET 182 is biased off and presents a high impedance. In this case, the output terminal 108 is at an intermediate voltage, for example about ½ Vreg. When the binary "1" return-to-zero 176a line pulses low and returns to high (as when the output 170 of the read out shift register is a logic "1" and the clock signal 144 pulses high and again low), while binary "1" return-to-zero 176a line is low, the PFET 180 is turned on and presents a low impedance. When PFET 180 is low impedance, Vreg is presented on the output terminal 108 and is seen by the external fixture 190 as a logic "1" return-to-zero signal. When the binary "1" return-to-zero 176a returns to a high value (when the clock signal 144 goes low), the PFET 180 is again high impedance, and the output terminal 108 returns to the intermediate voltage, about ½ Vreg. When binary "0" return-to-zero 176b pulses high and returns to low (as when output 170 of the readout shift register is a logic "0" and the clock signal 144 pulses high and again low), while the binary "0" return-to-zero 176a is high, the NFET 182 is turned on and presents a low impedance. When the NFET 182 is low impedance, ground is presented on the output terminal 108 and is seen by the external programmer 190 as a logic "0" return-to-zero signal. When the binary "0" return-to-zero 176b returns to a low value (when the clock signal 144 goes low), the NFET 182 is again high impedance, and the output terminal 108 returns to the intermediate voltage, about ½ Vreg. In this way, the data values stored in the readout shift register 140 are serially output on the output terminal 108 as a series of polar return-to-zero values. In an embodiment, the resistors 192, 194 may be about equal in resistance value. In an embodiment, the resistors 192, 194 may each be about 51 K Ohms in resistance. In another embodiment, however, the resistors 192, 194 may have values different than 51 K Ohms.

Figure 7:
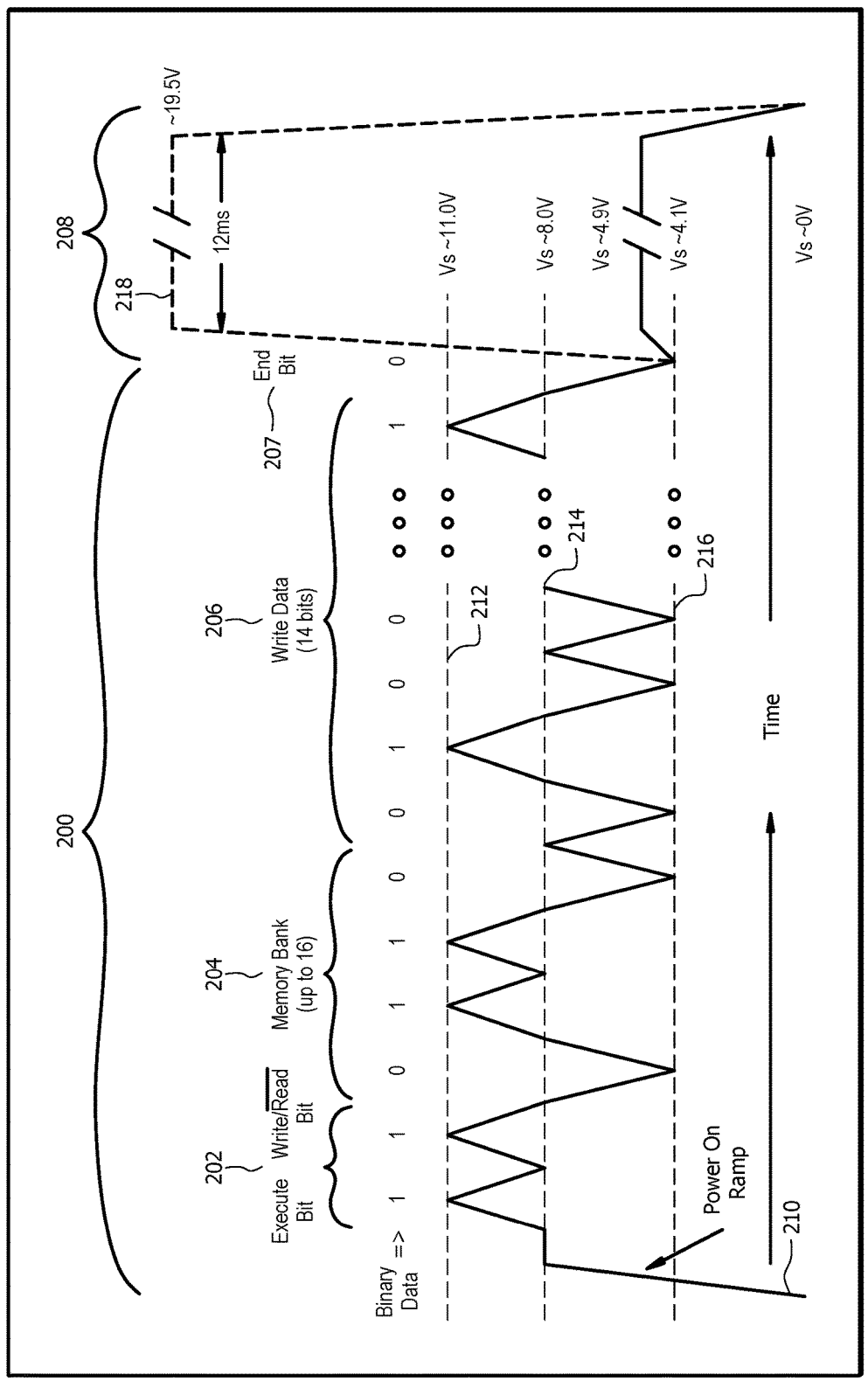
FIG. 7 is an illustration of a sensor memory write input signal according to an embodiment of the disclosure.

Turning now to FIG. 7, a write signal message 200 is described. The write signal message 200 may be modulated onto the power electrical terminal 104 to cause a memory bank of the memory 116 to be written to. The write signal message 200 may be a serial polar return-to-zero signal. For example, the zero level of the signal may be about 8 volts (label 214). The binary "1" value of the polar return-to-zero signal may be about 11 volts (label 212); the binary "0" value of the polar return-to-zero signal may be about 4.1 volts (label 216). Thus, to signal a binary "1" value, the voltage on the power electrical terminal 104 is raised from about 8 volts to about 11 volts and lowered again to about 8 volts, over a bit time, and to signal a binary "0" value, the voltage on the power electrical terminal 104 is lowered from about 8 volts to about 4.1 volts and raised again to about 8 volts, over a bit time. The bit times of the return-to-zero symbols of the write signal message 200 may each be about 50 us in duration, about 75 us in duration, about 100 us in duration, or some other period of time. In another embodiment, the zero level, the "1" binary value, and the "0" binary value may be different voltages than those listed here.

The start of the write signal message 200 comprises a power on ramp. During the power on ramp, the packaged sensor 100 is powered on. For example, the voltage regulator 118 activates and supplies regulated electrical power to the adjustment block 114 and to the sensing block 112. The write signal message 200 may include an execute bit and a write bit portion 202. When the write bit is a binary "1," this indicates that a write operation is to be performed. In an embodiment, the write signal may comprise 4 bits 204 that identify one of sixteen different memory banks to write to in the memory 116. In a different embodiment, either fewer or more bits may be used to identify less than sixteen memory banks or more than sixteen memory banks. The data to be written to the identified memory bank is comprised in write bits 206. As illustrated in FIG. 7, 14 bits of data may be written to the identified memory bank, but in another embodiment, a memory bank may comprise more or fewer bits of data. The write signal message 200 may terminate with an end bit 207 that is a binary "0" polar return-to-zero value. After the end bit has been transmitted, a voltage of about 4.9 volts may be applied to the electrical power terminal 104.

After the data has been written to the selected memory bank, the data may be made non-volatile by strobing the memory 116 with an appropriate electrical stimulus 208. As illustrated in FIG. 7, an elevated voltage 218 of about 19.5 volts is applied to the memory 116 for an extended period of time (about 12 ms as illustrated here). This elevated voltage may be provided by an internal charge pump component of the packaged sensor 100. Alternatively, in an embodiment, this elevated voltage may be applied to the electrical power terminal 104. Alternatively, in an embodiment, the packaged sensor 100 may have a fourth external terminal (not shown) that may be used to input a memory write or memory data commit command, for example the elevated voltage described above or some other voltage. After the data has been committed to non-volatile memory, the voltage on the electrical power terminal 104 may be dropped to about zero volts. This completes a memory write cycle. If it is desired to write data to other memory banks of memory 116, this same process may be repeated with a different set of bits in the memory bank identity bits 204 and appropriate data in the write data bits 206.

Figure 8:
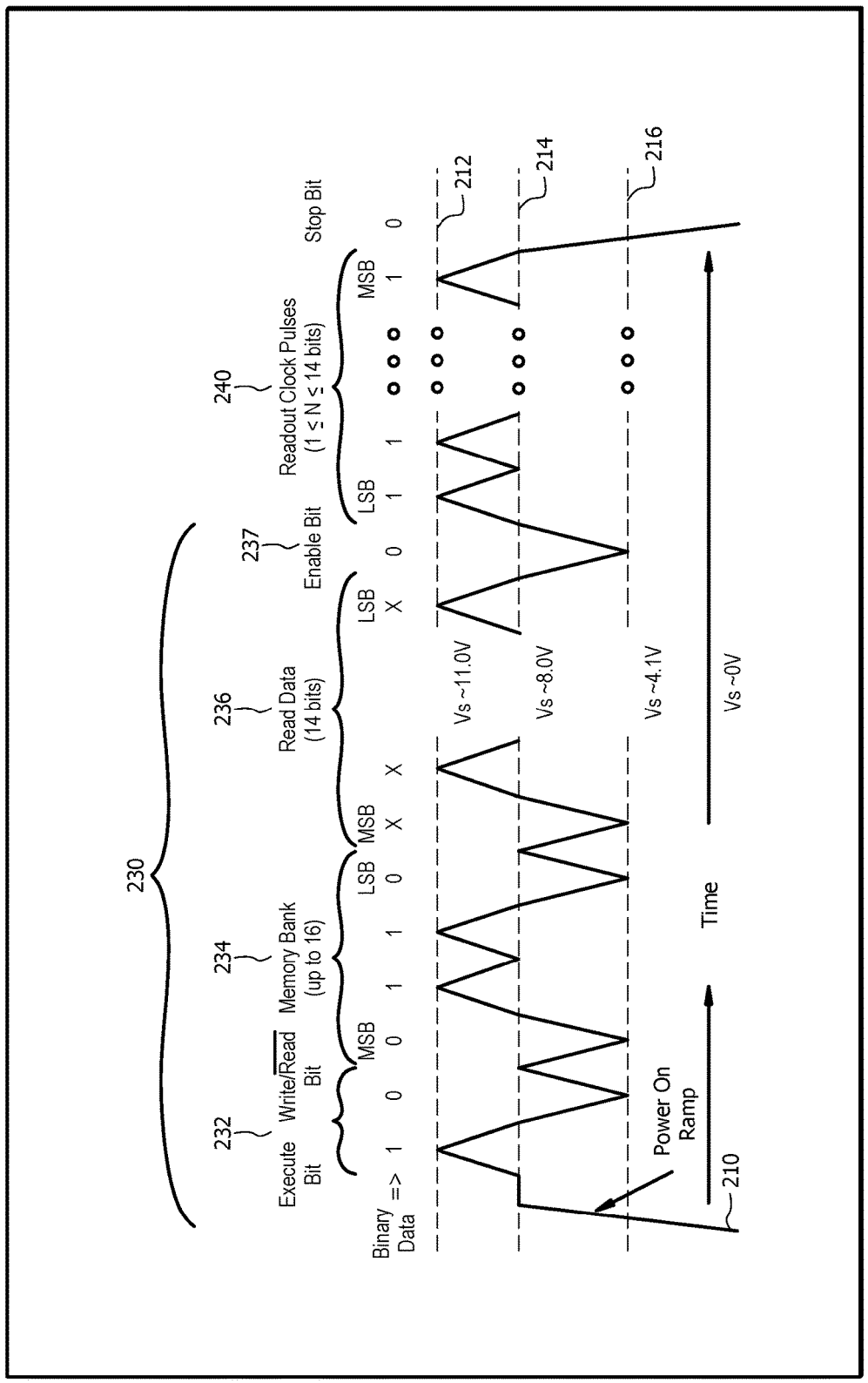
FIG. 8 is an illustration of a sensor memory readout input signal according to an embodiment of the disclosure.

Turning now to FIG. 8, a read signal message 230 is described. The read signal message 230 may be input to the power electrical terminal 104 to read from a memory bank of the memory 116. The read signal 230 may be a serial polar return-to-zero signal. For example, the zero level of the signal may be about 8 volts (label 214). The binary "1" value of the polar return-to-zero signal may be about 11 volts (label 212); the binary "0" value of the polar return-to-zero signal may be about 4.1 volts (label 216). Thus, to signal a binary "1" value, the voltage on the power electrical terminal 104 is raised from about 8 volts to about 11 volts and lowered again to about 8 volts, over a bit time, and to signal a binary "0" value, the voltage on the power electrical terminal 104 is lowered from about 8 volts to about 4.1 volts and raised again to about 8 volts, over a bit time. The bit times of the return-to-zero symbols of the read signal message 230 may each be about 50 us in duration, about 75 us in duration, about 100 us in duration, or some other period of time. In another embodiment, the zero level, the "1" binary value, and the "0" binary value may be different voltages than those listed here.

The start of the read signal message 230 comprises a power on ramp. During the power on ramp, the packaged sensor 100 is powered on. For example, the voltage regulator 118 activates and supplies regulated electrical power to the adjustment block 114 and to the sensing block 112. The read signal message 230 may include an execute bit and a NOT read bit portion 232. When the NOT read bit is a binary "0" polar return-to-zero value, this indicates that a readout operation is to be performed. In an embodiment, the read signal message 230 may comprise 4 bits 234 that identify one of sixteen different memory banks in the memory 116 from which to read out data. In a different embodiment, either fewer or more bits may be used to identify less than sixteen memory banks or more than sixteen memory banks. The read data 236 is input on the power electrical terminal 104 but is not written to memory 116 but rather supplies clocking signals to the adjustment block 114 during the readout operation. The read data 236 may be any values. Said in another way, the read data 236 may be "don't care" values, but they are desirably valid polar return-to-zero values. As illustrated in FIG. 8, 14 bits of read data may be input, but in another embodiment, more or fewer bits of read data may be input. The read signal message 230 may terminate with an enable bit 237 that is a binary "0" polar return-to-zero value. After the enable bit 237 has been input, a sequence of binary "1" polar return-to-zero values 240 may be input on the power electrical terminal 104 to cause the data in the selected memory bank to be clocked out or shifted out of the output terminal 108. In another embodiment, the adjustment block 114 may be configured such that after the enable bit 237 has been input, a sequence of binary "0" polar return-to-zero values may be input on the power electrical terminal 104 to cause the data in the selected memory bank to be clocked out or shifted out of the output terminal 108. After the last data bit is read out, the voltage on the power electrical terminal 104 may be dropped to zero providing a stop bit and ending the readout operation. The read signal 230 may be repeated identifying a different memory bank to readout data from a different memory bank of the memory 116.

Figure 9:
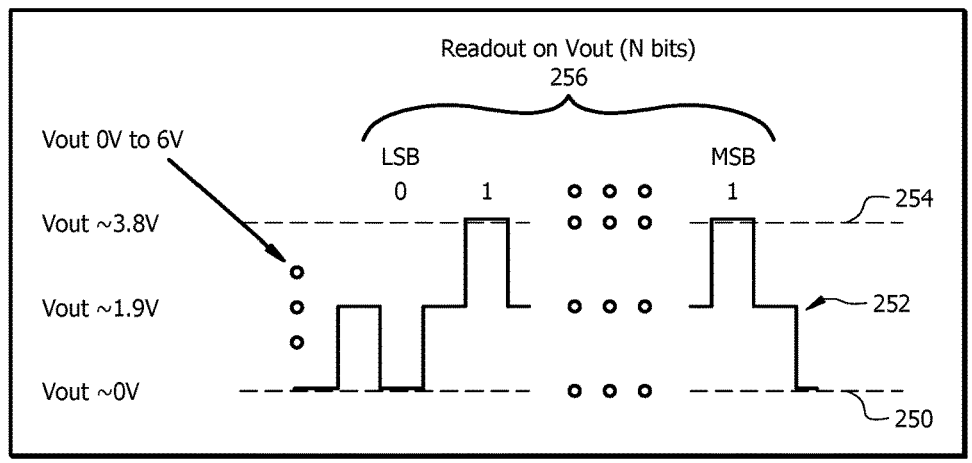
FIG. 9 is an illustration of a sensor memory readout output signal according to an embodiment of the disclosure.

Turning now to FIG. 9, a polar return-to-zero data readout 256 is depicted. While the data readout 256 depicted in FIG. 9 shows the least significant bit output first and the most significant bit output last, in another embodiment, the most significant bit may be output first and the least significant bit output last. This order is a function of the structuring and wiring of the readout shift register 140. As illustrated in FIG. 9, the polar return-to-zero level 252 is about 1.9 volts, the binary "1" polar return-to-zero value 254 is about 3.8 volts, and the binary "0" polar return-to-zero value 250 is about 0 volts. In another embodiment, however, different values of polar return-to-zero level 252, binary "1" polar return-to-zero value 254, and binary "0" polar return-to-zero value 250 may be employed. The data readout 256 are values that would be seen at the output terminal 108, for example by the external fixture 190.

Figure 10:
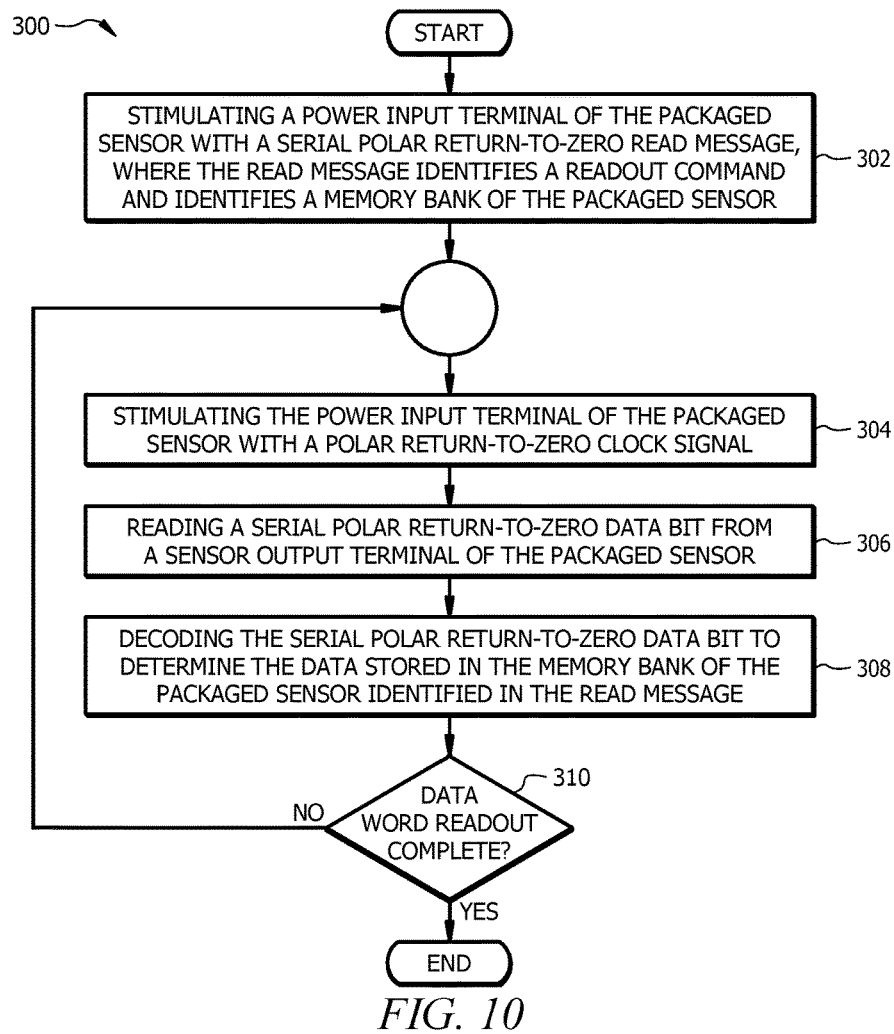
FIG. 10 is a flow chart of a method according to an embodiment of the disclosure.

Turning now to FIG. 10, a method 300 is described. The method 300 may be used to read out data from a memory bank of the memory 116 of the packaged sensor 100 described above. The method includes (A) stimulating a power input terminal of the packaged sensor 100 with a serial polar return-to-zero read message, where the read message identifies a readout command and identifies a memory bank of the packaged sensor; (B) stimulating the power input terminal of the packaged sensor with a polar return-to-zero clock signal; (C) reading a serial polar return-to-zero data word from a sensor output terminal of the packaged sensor; and (D) decoding the serial polar return-to-zero data word to determine the data stored in the memory bank of the packaged sensor identified in the read message. It will be appreciated that the processing of (B), (C), and (D) may be interleaved, as illustrated in FIG. 10. At block 302, a power input terminal of the packaged sensor 100 is stimulated with a serial polar return-to-zero read message, where the read message identifies a readout command and identifies a memory bank of the packaged sensor. At block 304, the power input terminal of the packaged sensor is stimulated with a serial polar return-to-zero clock signal. At block 306, a serial polar return-to-zero data bit is readout from a sensor output terminal of the packaged sensor. At block 308, the serial polar return-to-zero data bit is decoded to determine the data stored in the memory bank of the packaged sensor identified in the read message. At block 310, if the memory data word identified in block 302 has not yet been read out serially, the processing returns to block 304. By iterating the processing of blocks 304, 306, and 308, the complete data value (e.g., data word) stored in the identified bank of memory may be read out and decoded.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A packaged magnetic field sensor, comprising:
    a package housing;
    a power input terminal accessible from outside of the package housing;
    a magnetic field sensing device situated in the package housing;
    a sensor output terminal accessible from outside of the package housing for providing an output signal that is related to a magnetic field sensed by the magnetic field sensing device when the packaged magnetic field sensor is operated in a magnetic field sensing mode of operation and for providing a data readout signal related to stored data when the packaged magnetic field sensor is operated in a data readout mode of operation;
    a sensing block situated in the package housing and electrically coupled to the magnetic field sensing device and to the sensor output terminal; and
    an adjustment block situated in the package housing coupled to the power input terminal, coupled to the sensing block, coupled to the sensor output terminal, comprising a memory storing the stored data, operable to adjust at least one parameter of the output signal based on at least part of the stored data when the packaged magnetic field sensor is operated in the magnetic field sensing mode of operation, and operable to modulate the data readout signal onto the sensor output terminal in response to a data readout command modulated onto the power input terminal when the packaged magnetic field sensor is operated in the data readout mode of operation,
    wherein the adjustment block is operable to modulate the data readout signal onto the sensor output terminal in response to a serial polar return-to-zero data readout command modulated onto the power input terminal, and
    wherein the serial polar return-to-zero data readout command encodes a binary "1" polar return-to-zero value as a transition from an about 8 volt value to an about 11 volt value and back to an about 8 volt value and encodes a binary "0" polar return-to-zero value as a transition from an about 8 volt value to an about 4.1 volt value and back to an about 8 volt value.

2. The packaged magnetic field sensor of claim 1, wherein the data readout signal provided by the sensor output terminal when the packaged magnetic field sensor is operated in a data readout mode of operation is a serial polar return-to-zero signal.

3. The packaged magnetic field sensor of claim 2, wherein the serial polar return-to-zero signal provided by the sensor output terminal encodes a binary "1" polar return-to-zero value as a transition from an about 1.9 volt value to an about 3.8 volt value and back to an about 1.9 volt value and encodes a binary "0" polar return-to-zero value as a transition from an about 1.9 volt value to an about 0 volt value and back to an about 1.9 volt value.

4. The packaged magnetic field sensor of claim 1, wherein the memory stores information about a manufacturing of the packaged magnetic field sensor.

5. The packaged magnetic field sensor of claim 1, wherein the adjustment block comprises a multiplexor coupled to the memory and to a readout shift register, where the multiplexor selects one of plurality of memory banks of the memory to couple to the readout shift register in response to the data readout command when the packaged magnetic field sensor is operated in the data readout mode of operation, where the data readout command encodes an identity of the selected one of the plurality of memory banks of the memory.

6. A packaged sensor having three external electrical terminals, comprising:
    a package housing;
    a power input terminal accessible from outside of the package housing;
    a ground terminal accessible from outside the package housing;
    a sensing device situated in the package housing;
    a sensor output terminal accessible from outside of the package housing for providing an output signal that is related to a physical quantity sensed by the sensing device when the packaged sensor is operated in a sensing mode of operation and for providing a data readout signal related to stored data when the packaged sensor is operated in a data readout mode of operation;
    a sensing block situated in the package housing and electrically coupled to the sensing device and to the sensor output terminal; and
    an adjustment block situated in the package housing coupled to the power input terminal, coupled to the sensing block, coupled to the sensor output terminal, comprising a memory storing the stored data, and operable to modulate the data readout signal onto the sensor output terminal in response to a data readout command modulated onto the power input terminal when the packaged sensor is operated in the data readout mode of operation, wherein the adjustment block is operable to modulate the data readout signal onto the sensor output terminal in response to a serial polar return-to-zero data readout command modulated onto the power input terminal, and wherein the serial polar return-to-zero data readout command encodes a binary "1" polar return-to-zero value as a transition from an about 8 volt value to an about 11 volt value and back to an about 8 volt value and encodes a binary "0" polar return-to-zero value as a transition from an about 8 volt value to an about 4.1 volt value and back to an about 8 volt value.

7. The packaged sensor of claim 6, wherein the adjustment block is further operable to adjust at least one parameter of the output signal based on at least part of the stored data when the packaged sensor is operated in the sensing mode of operation.

8. The packaged sensor of claim 6, wherein the sensing device senses one of a magnetic field intensity, a flow rate, a temperature, a displacement, a pressure, a relative humidity, a force, or a presence of a gas.

9. The packaged sensor of claim 6, further comprising a voltage regulator coupled to the power input terminal and configured to provide a regulated voltage to the sensing block and to the adjustment block when a voltage provided on the power input terminal is at least equal to a threshold amount.

10. The packaged sensor of claim 6, wherein the adjustment block is further operable to write data input modulated on the power input terminal into the memory when the packaged sensor is operated in a data write mode of operation.

11. The packaged sensor of claim 6, wherein the packaged sensor has no other terminals accessible from outside the package housing other than the power input terminal, the ground terminal, and the sensor output terminal.

12. A method of reading out data stored in a packaged sensor having three external electrical terminals, comprising:
stimulating a power input terminal of the packaged sensor with a serial polar return-to-zero read message, where the read message identifies a readout command and identifies a memory bank of the packaged sensor;
stimulating the power input terminal of the packaged sensor with a polar return-to-zero clock signal;
reading a serial polar return-to-zero data word from a sensor output terminal of the packaged sensor; and
decoding the serial polar return-to-zero data word to determine the data stored in the memory bank of the packaged sensor identified in the read message,
wherein the serial polar return-to-zero read message encodes a binary "1" polar return-to-zero value as a transition from an about 8 volt value to an about 11 volt value and back to an about 8 volt value and encodes a binary "0" polar return-to-zero value as a transition from an about 8 volt value to an about 4.1 volt value and back to an about 8 volt value.

13. The method of claim 12, wherein the serial polar return-to-zero data word read from the sensor output terminal encodes a binary "1" polar return-to-zero value as a transition from an about 1.9 volt value to an about 3.8 volt value and back to an about 1.9 volt value and encodes a binary "0" polar return-to-zero value as a transition from an about 1.9 volt value to an about 0 volt value and back to an about 1.9 volt value.

14. The method of claim 12, further comprising passing the data in the memory bank of the packaged sensor identified by the read message through a multiplexor of the packaged sensor to a readout shift register of the packaged sensor.

15. The method of claim 14, further comprising serially shifting out the data from the readout shift register in response to the polar return-to-zero clock signal.

16. The method of claim 12, wherein bit times of the serial polar return-to-zero read message and the polar return-to-zero clock signal are about 50 us in duration.

17. The method of claim 12, wherein the packaged sensor is a magnetic field intensity sensor.

* * * * *